United States Patent
Hsu et al.

(10) Patent No.: US 8,405,177 B2
(45) Date of Patent: Mar. 26, 2013

(54) METHOD TO OPTIMIZE SUBSTRATE THICKNESS FOR IMAGE SENSOR DEVICE

(75) Inventors: Tzu-Hsuan Hsu, Kaohsiung (TW); Alex Hsu, Hsinchu (TW); Ching-Chun Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/238,420

(22) Filed: Sep. 21, 2011

(65) Prior Publication Data
US 2012/0007204 A1    Jan. 12, 2012

Related U.S. Application Data

(60) Continuation of application No. 12/904,903, filed on Oct. 14, 2010, now Pat. No. 8,030,721, which is a division of application No. 12/371,146, filed on Feb. 13, 2009, now Pat. No. 7,838,325.

(51) Int. Cl.
*H01L 21/00* (2006.01)
(52) U.S. Cl. ......................... 257/431; 438/30
(58) Field of Classification Search .............. 257/431, 257/E27.131; 438/68
See application file for complete search history.

(56) References Cited

U.S. PATENT DOCUMENTS

| | | | |
|---|---|---|---|
| 7,102,184 B2 * | 9/2006 | Rhodes | 257/292 |
| 7,598,136 B2 * | 10/2009 | Park et al. | 438/201 |
| 7,838,325 B2 | 11/2010 | Hsu et al. | |
| 2006/0244020 A1 * | 11/2006 | Lee | 257/291 |
| 2007/0037312 A1 * | 2/2007 | Noh | 438/57 |
| 2008/0057612 A1 * | 3/2008 | Doan et al. | 438/57 |
| 2009/0026511 A1 | 1/2009 | Brady et al. | |
| 2009/0045321 A1 * | 2/2009 | Bae et al. | 250/208.1 |
| 2009/0200587 A1 | 8/2009 | Venezia et al. | |
| 2009/0200590 A1 | 8/2009 | Mao et al. | |
| 2009/0200625 A1 * | 8/2009 | Venezia et al. | 257/432 |
| 2009/0302358 A1 | 12/2009 | Mao et al. | |
| 2009/0302409 A1 | 12/2009 | Qian et al. | |
| 2010/0123069 A1 | 5/2010 | Mao et al. | |
| 2010/0140675 A1 | 6/2010 | Rhodes | |
| 2010/0184242 A1 * | 7/2010 | Lin et al. | 438/57 |
| 2010/0207230 A1 | 8/2010 | Hsu et al. | |
| 2011/0031542 A1 | 2/2011 | Hsu et al. | |

\* cited by examiner

*Primary Examiner* — Thao P. Le
(74) *Attorney, Agent, or Firm* — Haynes and Boone, LLP

(57) ABSTRACT

Provided is a method for fabricating an image sensor device that includes providing a substrate having a front side and a back side; patterning a photoresist on the front side of the substrate to define an opening having a first width, the photoresist having a first thickness correlated to the first width; performing an implantation process through the opening using an implantation energy correlated to the first thickness thereby forming a first doped isolation feature; forming a light sensing feature adjacent to the first doped isolation feature, the light sensing feature having a second width; and thinning the substrate from the back side so that the substrate has a second thickness that does not exceed twice a depth of the first doped isolation feature. A pixel size is substantially equal to the first and second widths.

20 Claims, 7 Drawing Sheets

METHOD TO OPTIMIZE SUBSTRATE THICKNESS FOR IMAGE SENSOR DEVICE

PRIORITY DATA

This Application is a Continuation Application of U.S. Ser. No. 12/904,903 filed on Oct. 14, 2010, now U.S. Pat. No. 8,030,721, issued Oct. 4, 2011, entitled "METHOD TO OPTIMIZE SUBSTRATE THICKNESS FOR IMAGE SENSOR DEVICE," which is a Divisional Application of U.S. Ser. No. 12/371,146 filed on Feb. 13, 2009, now U.S. Pat. No. 7,838,325, issued on Nov. 23, 2010, entitled "METHOD TO OPTIMIZE SUBSTRATE THICKNESS FOR IMAGE SENSOR DEVICE," both disclosures of which are incorporated herein by reference in their entirety.

BACKGROUND

In semiconductor technologies, an image sensor provides a grid of pixels, such as photosensitive diodes or photodiodes, reset transistors, source follower transistors, pinned layer photodiodes, and/or transfer transistors for recording an intensity or brightness of light. The pixel responds to the light by accumulating a charge—the more light, the higher the charge. The charge can then be used by another circuit so that a color and brightness can be used for a suitable application, such as a digital camera. Common types of pixel grids include a charge-coupled device (CCD) or complimentary metal oxide semiconductor (CMOS) image sensor (CIS). Back-side illuminated image sensors are used for sensing a volume of exposed light projected towards the backside surface of a substrate. The pixels are located on a front side of the substrate, and the substrate is thin enough so that light projected towards the backside of the substrate can reach the pixels. Back-side illuminated sensors provide a high fill factor and reduced destructive interference, as compared to front-side illuminated sensors.

However, image sensor devices suffer from "cross-talk." That is, light targeted for one image sensor element (and the electrical signal generated thereby) may spread to neighboring image sensor elements, which causes cross-talk. Cross-talk will degrade spatial resolution, reduce overall optical sensitivity, and result in poor color separation. As device sizes continue to get scaled down, pixel sizes continue to shrink as well, which may exacerbate problems such as cross-talk.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
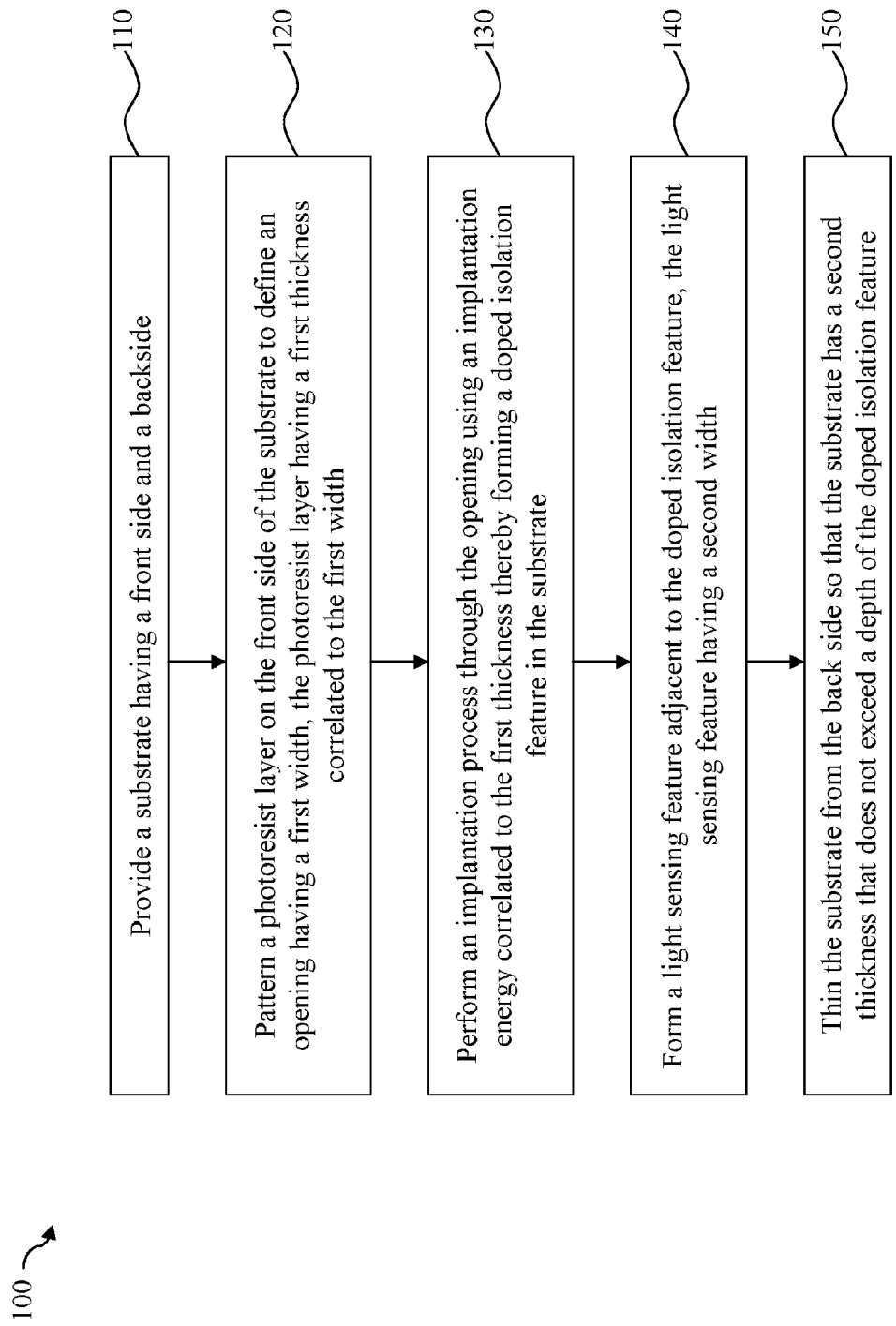
FIG. 1 is a flowchart illustrating a method of fabricating an image sensor device according to various aspects of the present disclosure.
Figure 2A:
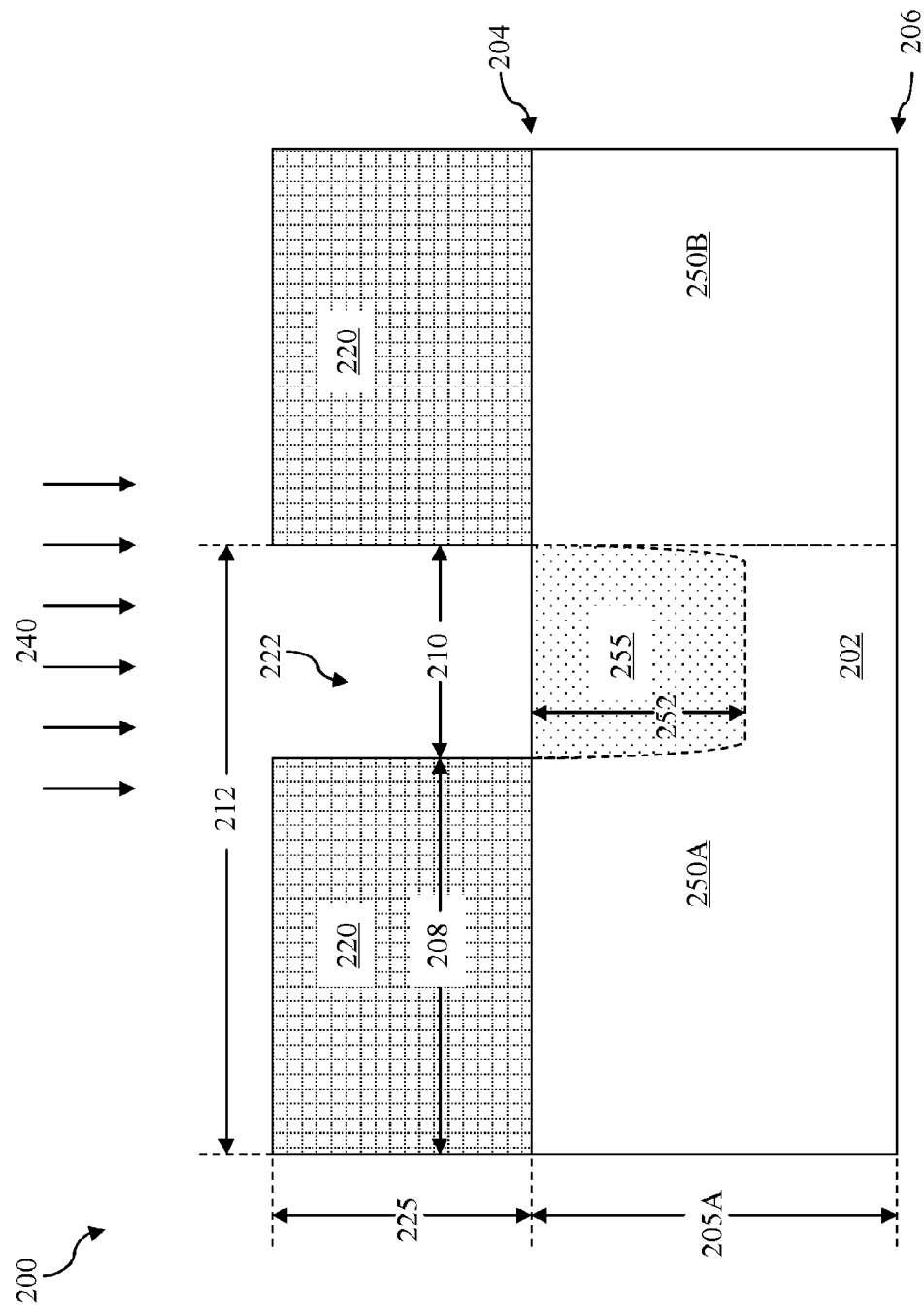
FIGS. 2A to 2C are cross-sectional views of an image sensor device at various stages of fabrication according to the method of FIG. 1.
Figure 2B:
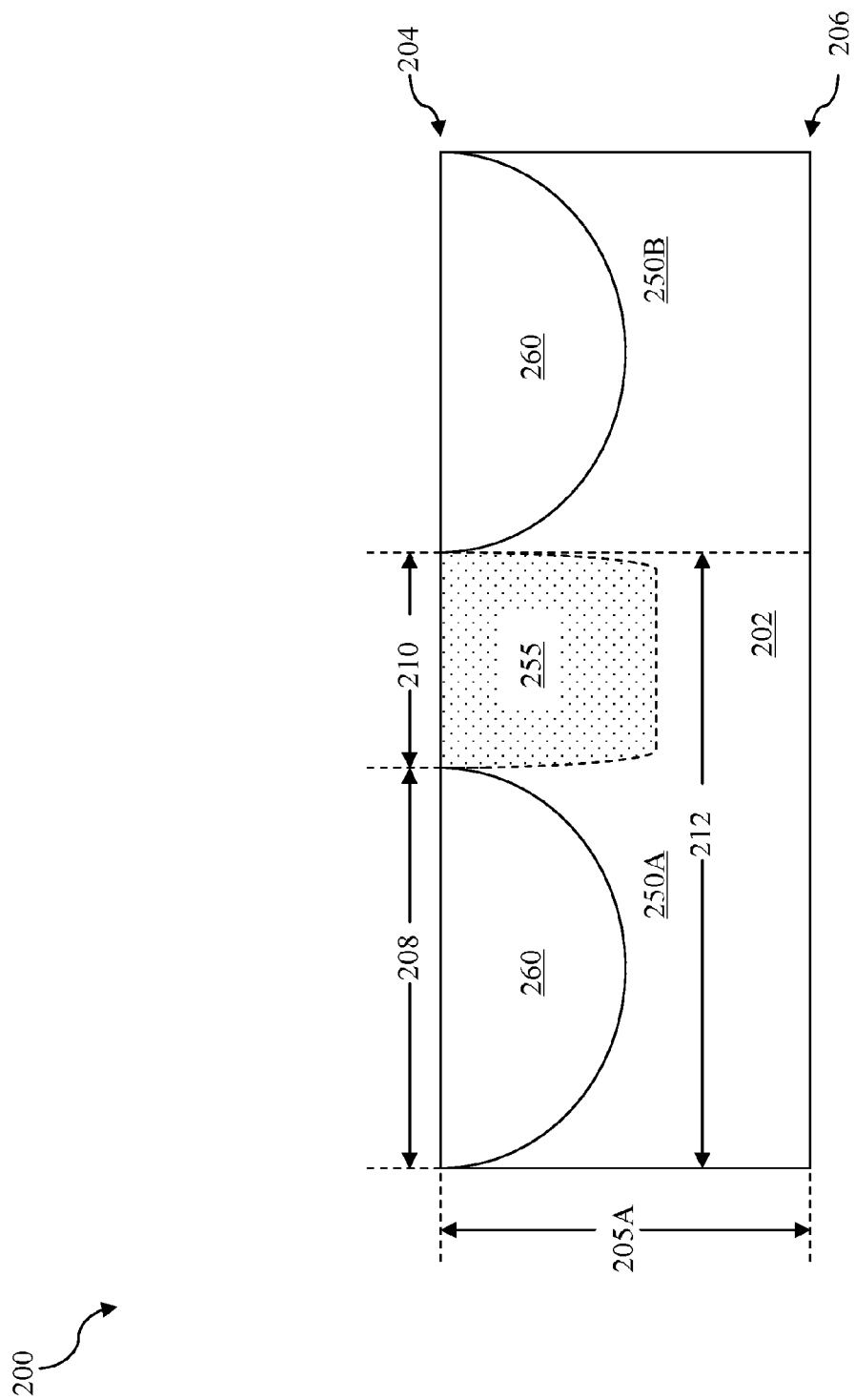
Figure 2C:
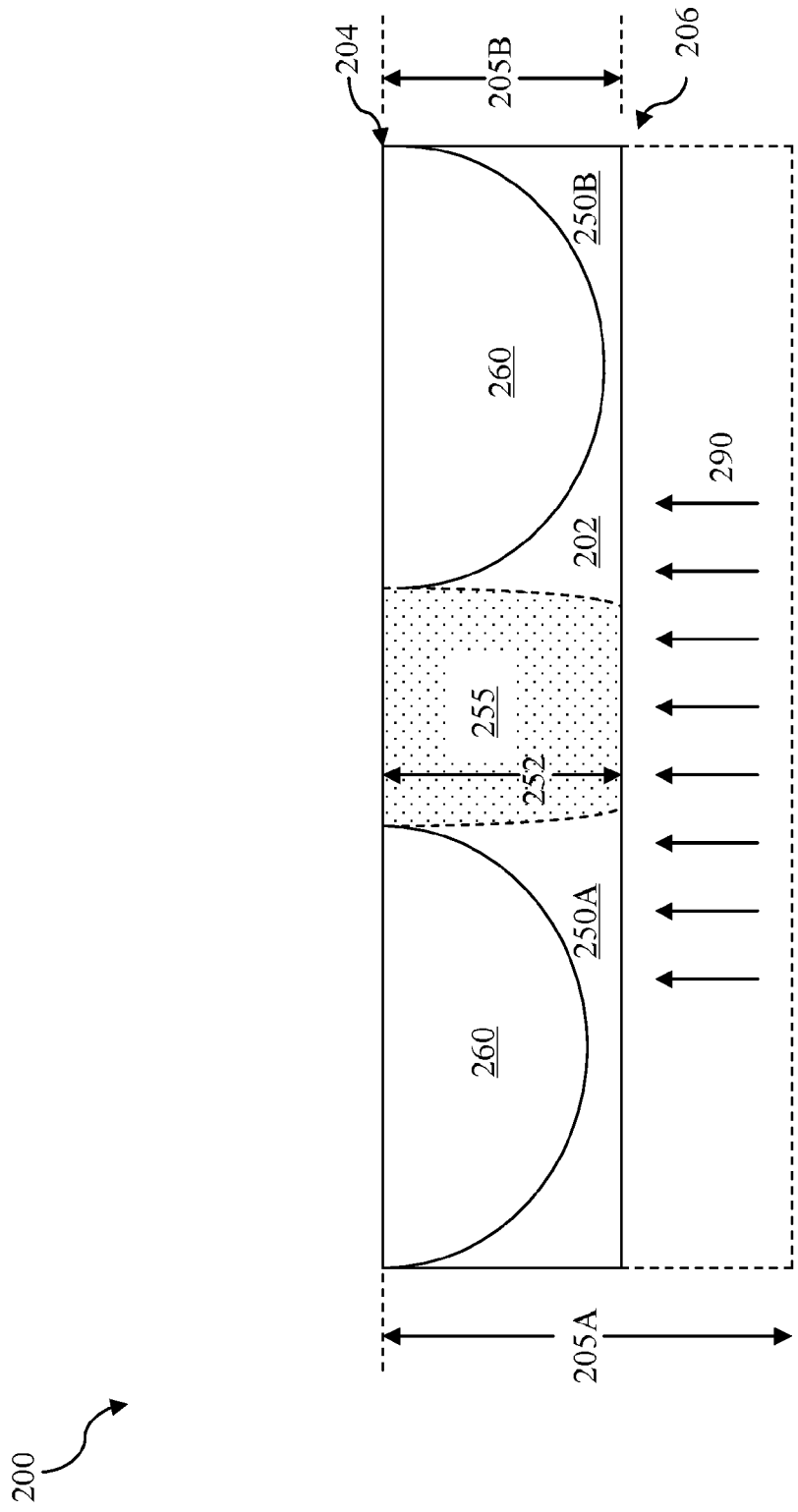

Illustrated in FIG. 1 is a flowchart of a method 100 for fabricating an image sensor device according to various aspects of the present disclosure. FIGS. 2A to 2C are cross-sectional views of one embodiment of an image sensor device 200 at various stages of fabrication according to the method 100 of FIG. 1. The image sensor device 200 includes a grid or array of pixels for sensing and recording an intensity of light radiation. The image sensor device 200 may include a charge-coupled device (CCD), complimentary metal oxide semiconductor (CMOS) image sensor (CIS), an active-pixel sensor (APS), and a passive-pixel sensor. The image sensor device 200 further includes additional circuitry and input/outputs that are provided adjacent to the grid of pixels for providing an operation environment for the pixels and for supporting external communications with the pixels. It is understood that FIGS. 2A to 2C have been simplified for a better understanding of the inventive concepts of the present disclosure.

Referring to FIG. 1, the method 100 begins with block 110 in which a substrate having a front side and a backside is provided. Referring also to FIG. 2A, the image sensor device 200 includes a semiconductor substrate 202 having a front side 204 and a backside 206. In the present embodiment, the substrate 202 is a silicon substrate doped with a P-type dopant such as boron (e.g., P-type substrate). In another embodiment, the substrate 202 is a silicon substrate doped with an N-type dopant such as phosphorous (e.g., N-type substrate). In other embodiments, the substrate 202 includes other elementary semiconductors such as germanium and diamond. Alternatively, the substrate 202 may include a compound semiconductor and/or an alloy semiconductor. Further, the substrate 202 may optionally include an epitaxial layer (epi layer), may be strained for performance enhancement, and may include a silicon-on-insulator (SOI) structure. The substrate 202 also has an initial thickness 205A that ranges from about 100 um to about 3000 um. In the present embodiment, the initial thickness 205A is about 700 um.

The method 100 continues with block 120 in which a photoresist is patterned on the front side of the substrate to define an opening having a first width, the photoresist has a first thickness correlated to the first width. A photoresist layer is formed on the front side 204 of the substrate 202. The photoresist layer is then patterned by a lithography process to form a mask layer 220 that includes an opening 222. For example, the lithography process may use a photomask and a positive photoresist material for the mask layer 220. The mask layer 220 has a width 208, and the opening 222 has a width 210. The mask layer 220 is used to form a doped isolation structure disposed between pixels 250A and 250B in the substrate 202. In the present embodiment, the pixels 250A, 250B each has a pixel size 212 that is approximately equal to a sum of the widths 208 and 210.

A relationship between the pixel size and an optimized substrate thickness can be determined based on a design rule of a doped isolation feature. For example, the design rule includes a minimum photoresist width (such as width 208) that is formed by the lithography process, a minimum exposure width (such as width 210) of the lithography process, a minimum photoresist thickness (such as thickness 255 discussed below) for resisting an implantation energy used to form the doped isolation feature, and an effective implant depth (such as depth 252 discussed below) of the implantation energy. It should be noted that the relationship may include other factors that effect the formation of the doped isolation feature such as type of dopants used. The doped isolation feature is designed to have a minimum width to reduce the impact on sensitivity while having sufficient depth to reduce cross-talk between adjacent pixels. Accordingly, the optimized substrate thickness is correlated and derived from the depth of the doped isolation feature. The depth of the doped isolation feature will depend on whether an implantation process is performed to the front side of the substrate (in FIG. 1), or to the front side and the backside of the substrate (in FIG. 3). The optimized substrate thickness represents a maximum thickness that the substrate should have after it has been thinned-down from the backside. Thus, the doped isolation feature is designed to substantially extend from the front side to the backside of the substrate to reduce cross talk between adjacent pixels. The various parameters and specifications of the image sensor device 200 are determined from the relationship between the pixel size and the optimized substrate thickness as discussed below.

The pixel size 212 is set to a pre-defined pixel size by design requirements provided by a design engineer or customer. As noted above, the widths 208 and 210 are correlated with each other since their sum is approximately equal to the pixel size 212. Hence, an optimization algorithm may be used to determine (or set) the widths 208 and 210. In the present embodiment, the optimization algorithm includes a ratio between the widths 208 and 210, specifically, width 208/width 210. The ratio is equal to about 11/7 (about 1.571). It has been observed that the mask layer 220 has a thickness 225 that is correlated to the width 210 of the opening 222 and to the width 208 of the mask layer. In the present embodiment, the thickness 225 is about 5.5 times the width 210, and is about 3.5 times the width 208. These values may be determined experimentally with a particular lithography process, and may include a range of values so as to form a suitable and acceptable pattern for the implantation process. At this point, the widths 208 and 210 and the thickness 225 can be derived for a range of pixel sizes 212 specified by various design requirements. It has been observed that a light sensing element having a width substantially equal to the width 208 and the doped isolation feature having a width substantially equal to the width 210 results in an image pixel having an optimized light sensitivity and reduction in cross-talk with adjacent pixels.

To illustrate, refer to Table 1 below. Table 1 lists exemplary values for the present embodiment using boron as a dopant to form the isolation feature below the opening 222 (doping will be discussed in detail later). Starting from the left, column A includes a list of pixel sizes 212. As previously mentioned, the pixel size 212 is specified by design requirements. Column B includes the optimization algorithm (which is a ratio in the present embodiment) for each pixel size 212. Also note that the optimization ratio remains the same for all values of the pixel size 212 for the present embodiment. Column C lists values of width 208 corresponding to each pixel size 212 and the optimization algorithm. Column D lists values of width 210 corresponding to each pixel size 212 and the optimization algorithm. In other words, the design requirements and the optimization algorithm specify two equations and two variables. The two variables are the widths 208 and 210. The two equations are: pixel size 212=width 208+width 210; and the optimization algorithm (or ratio)=width 208/width 210=1.571. Using these two equations, the two variables (widths 208 and 210) are solved. As an example, when the pixel size 212 is specified to be about 0.701 um by design requirements, and using an optimization algorithm (or ratio) of about 1.571, the width 208 and the width 210 are calculated to be about 0.429 um and 0.273 um, respectively.

Column E includes a list of values for the thickness 225 of the photoresist layer 220. As mentioned above, the thickness 225 is about 5.5 times the width 210, or about 3.5 times the width 208. Hence, once the width 210 is determined by the calculations above, the thickness 225 is determined for each pixel size 212 as well. For example, when the pixel size is about 0.701 um, the width 210 of the opening 222 is calculated to be about 0.273 um, and the thickness 225 of the photoresist layer 220 is calculated to be about 5.5×0.273 um=1.5 um. Columns F to I will be discussed in more detail below. Also, Table 2 is shown after Table 1. Table 2 lists exemplary values for an alternative embodiment using phosphorous as a dopant to form the isolation feature. Note that although the optimization ratio is shown to be about 1.571 in both Table 1 and Table 2, it may vary in other embodiments. For example, the optimization ratio may range between 1.25 and 1.85 in other embodiments.

TABLE 1

Using boron as a dopant to form an isolation feature

| Column A Pixel size 212 (um) | Column B Optimization algorithm (ratio of width 208 to width 210) | Column C Width 208 of mask 220 (um) | Column D Width 210 of opening 222 (um) | Column E Thickness 225 of photoresist layer (um) | Column F Implant energy (KeV) | Column G Effective implant depth 252, 452 (um) | Column H Substrate thickness 205B with front side implant (um) | Column I Substrate thickness 405 with front and back side implant (um) |
|---|---|---|---|---|---|---|---|---|
| 0.7013 | 1.5714286 | 0.42857 | 0.2727 | 1.50 | 500 | 1.28 | 1.28 | 2.56 |
| 0.87429 | 1.5714286 | 0.53429 | 0.34 | 1.87 | 600 | 1.43 | 1.43 | 2.86 |
| 0.98182 | 1.5714286 | 0.6 | 0.3818 | 2.10 | 700 | 1.56 | 1.56 | 3.12 |
| 1.02857 | 1.5714286 | 0.62857 | 0.4 | 2.20 | 800 | 1.68 | 1.68 | 3.36 |
| 1.12208 | 1.5714286 | 0.68571 | 0.4364 | 2.40 | 900 | 1.81 | 1.81 | 3.62 |
| 1.21558 | 1.5714286 | 0.74286 | 0.4727 | 2.60 | 1000 | 1.92 | 1.92 | 3.84 |
| 1.26234 | 1.5714286 | 0.77143 | 0.4909 | 2.70 | 1100 | 2.03 | 2.03 | 4.06 |
| 1.4026 | 1.5714286 | 0.85714 | 0.5455 | 3.00 | 1200 | 2.15 | 2.15 | 4.3 |
| 1.51948 | 1.5714286 | 0.92857 | 0.5909 | 3.25 | 1300 | 2.26 | 2.26 | 4.52 |
| 1.54286 | 1.5714286 | 0.94286 | 0.6 | 3.30 | 1400 | 2.36 | 2.36 | 4.72 |
| 1.58961 | 1.5714286 | 0.97143 | 0.6182 | 3.40 | 1500 | 2.47 | 2.47 | 4.94 |

TABLE 1-continued

Using boron as a dopant to form an isolation feature

| Column A Pixel size 212 (um) | Column B Optimization algorithm (ratio of width 208 to width 210) | Column C Width 208 of mask 220 (um) | Column D Width 210 of opening 222 (um) | Column E Thickness 225 of photoresist layer (um) | Column F Implant energy (KeV) | Column G Effective implant depth 252, 452 (um) | Column H Substrate thickness 205B with front side implant (um) | Column I Substrate thickness 405 with front and back side implant (um) |
|---|---|---|---|---|---|---|---|---|
| 1.65974 | 1.5714286 | 1.01429 | 0.6455 | 3.55 | 1600 | 2.57 | 2.57 | 5.14 |
| 1.68312 | 1.5714286 | 1.02857 | 0.6545 | 3.60 | 1700 | 2.68 | 2.68 | 5.36 |
| 1.82338 | 1.5714286 | 1.11429 | 0.7091 | 3.90 | 1800 | 2.79 | 2.79 | 5.58 |
| 1.96364 | 1.5714286 | 1.2 | 0.7636 | 4.20 | 2000 | 2.99 | 2.99 | 5.98 |
| 2.1039 | 1.5714286 | 1.28571 | 0.8182 | 4.50 | 2250 | 3.26 | 3.26 | 6.52 |
| 2.33766 | 1.5714286 | 1.42857 | 0.9091 | 5.00 | 2500 | 3.51 | 3.51 | 7.02 |

TABLE 2

Using phosphorous as a dopant to form an isolation feature

| Column A Pixel size 212 (um) | Column B Optimization algorithm (ratio of width 208 to width 210) | Column C Width 208 of mask 220 (um) | Column D Width 210 of opening 222 (um) | Column E Thickness 225 of photoresist layer (um) | Column F Implantation energy (KeV) | Column G Effective implant depth 252, 352 (um) | Column H Substrate thickness 205B with front side implant (um) | Column I Substrate thickness 405 with front and back side implant (um) |
|---|---|---|---|---|---|---|---|---|
| 0.6545 | 1.5714286 | 0.4 | 0.25455 | 1.40 | 500 | 0.75 | 0.75 | 1.5 |
| 0.6779 | 1.5714286 | 0.41429 | 0.26364 | 1.45 | 600 | 0.87 | 0.87 | 1.74 |
| 0.7013 | 1.5714286 | 0.42857 | 0.27273 | 1.50 | 700 | 0.98 | 0.98 | 1.96 |
| 0.7294 | 1.5714286 | 0.44571 | 0.28364 | 1.56 | 800 | 1.08 | 1.08 | 2.16 |
| 1.0286 | 1.5714286 | 0.62857 | 0.4 | 2.20 | 900 | 1.18 | 1.18 | 2.36 |
| 1.0519 | 1.5714286 | 0.64286 | 0.40909 | 2.25 | 1000 | 1.27 | 1.27 | 2.54 |
| 1.0753 | 1.5714286 | 0.65714 | 0.41818 | 2.30 | 1100 | 1.35 | 1.35 | 2.7 |
| 1.0987 | 1.5714286 | 0.67143 | 0.42727 | 2.35 | 1200 | 1.43 | 1.43 | 2.86 |
| 1.1221 | 1.5714286 | 0.68571 | 0.43636 | 2.40 | 1300 | 1.50 | 1.50 | 3 |
| 1.1455 | 1.5714286 | 0.7 | 0.44545 | 2.45 | 1400 | 1.57 | 1.57 | 3.14 |
| 1.1688 | 1.5714286 | 0.71429 | 0.45455 | 2.50 | 1500 | 1.64 | 1.64 | 3.28 |
| 1.1922 | 1.5714286 | 0.72857 | 0.46364 | 2.55 | 1600 | 1.71 | 1.71 | 3.42 |
| 1.2156 | 1.5714286 | 0.74286 | 0.47273 | 2.60 | 1700 | 1.77 | 1.77 | 3.54 |
| 1.239 | 1.5714286 | 0.75714 | 0.48182 | 2.65 | 1800 | 1.83 | 1.83 | 3.66 |
| 1.2623 | 1.5714286 | 0.77143 | 0.49091 | 2.70 | 2000 | 1.95 | 1.95 | 3.9 |
| 1.3325 | 1.5714286 | 0.81429 | 0.51818 | 2.85 | 2250 | 2.08 | 2.08 | 4.16 |
| 1.4494 | 1.5714286 | 0.88571 | 0.56364 | 3.10 | 2500 | 2.22 | 2.22 | 4.44 |
| 1.5429 | 1.5714286 | 0.94286 | 0.6 | 3.30 | 2750 | 2.35 | 2.35 | 4.7 |
| 1.6364 | 1.5714286 | 1 | 0.63636 | 3.50 | 3000 | 2.46 | 2.46 | 4.92 |

The method 100 continues with block 130 in which an implantation process using an implantation energy correlated to the first thickness is performed through the opening, thereby forming a doped isolation feature in the substrate. An implantation process 240 is performed to the substrate 202 through the opening 222, while the mask 220 resists the implantation energy and protects a portion of the substrate below the mask 220. The implantation process 240 uses boron as a dopant in the present embodiment. In an alternative embodiment, the implantation process 240 uses phosphorous as a dopant. The implantation process 240 also has an implantation energy that is correlated with the thickness 225 of the mask layer 220. In the present embodiment, the implantation energy of the implantation process 240 is a maximum amount of implantation energy that can be tolerated (or effectively blocked) by the mask 220 having the thickness 225. Referring to Table 1 above for an illustration of the present embodiment using boron as a dopant, Column F lists a range of values for the implantation energy. An implantation energy of 500 KeV correlates to the thickness 225 of the photoresist layer 220 having a value of 1.5 um. Note that the implantation energy of 500 KeV also correlates to a pixel size 212 of 0.701 um. It can be observed that, as the pixel size 212 ranges from about 0.701 um to about 2.338 um, the thickness 225 of the photoresist layer 220 ranges from about 1.5 um to about 5 um correspondingly, and the implantation energy of the implantation process 240 ranges from about 500 KeV to about 2500 KeV correspondingly.

Referring to Table 2 above for an illustration of an alternative embodiment using phosphorous as a dopant, the implantation energy is 500 KeV for the thickness 225 of the photoresist layer 220 having a value of 1.4 um. Note that the implantation energy of 500 KeV also correlates to a pixel size 212 of 0.655 um. It can be observed that, as the pixel size 212 ranges from about 0.655 um to about 1.636 um, the thickness 225 of the photoresist layer 220 ranges from about 1.4 um to about 3.5 um correspondingly, and the implantation energy of the implantation process 240 ranges from about 500 KeV to about 3000 KeV correspondingly.

The implantation process 240 forms a doped isolation feature 255 below the opening 222. In the present embodiment, the isolation feature 255 is substantially aligned with the opening 222. Hence, the isolation feature 255 has a maximum width substantially equal to the width 210 of the opening 222. The isolation feature 255 has an effective implant depth 252 that is also correlated with the implantation energy of the implantation process 240. The effective implant depth 252 also varies depending on the type of dopant used for the implantation process 240. Referring again to Table 1 for an illustration of the present embodiment using boron as a dopant, Column G lists a range of values for the effective implant depth 252. An effective implant depth 252 of 1.28 um correlates to an implantation energy of 500 KeV. Note that the effective implant depth 252 also correlates to a pixel size 212 of 0.701 um. It can be observed that, as the pixel size 212 ranges from about 0.701 um to about 2.338 um, the implantation energy of the implantation process 240 ranges from about 500 KeV to about 2500 KeV correspondingly, and the effective implant depth 252 ranges from about 1.28 um to about 3.51 um correspondingly. Referring to Table 2 for an illustration of an alternative embodiment using phosphorous as a dopant, Column G lists a range of values for the effective implant depth 252. An effective implant depth 252 of 0.75 um correlates to an implantation energy of 500 KeV. Note that the effective implant depth 252 also correlates to a pixel size 212 of 0.655 um. It can be observed that, as the pixel size 212 ranges from about 0.655 um to about 1.636 um, the implantation energy of the implantation process 240 ranges from about 500 KeV to about 3000 KeV correspondingly, and the effective implant depth 252 ranges from about 0.75 um to about 2.46 um correspondingly.

The method 100 continues with block 140 in which a light sensing feature adjacent to the doped isolation feature is formed, wherein the light sensing feature has a second width correlated to the first width. Referring to FIG. 2B, the mask layer 220 is removed. Thereafter, a light sensing feature 260 is formed in the front side 204 of the substrate 202 and adjacent to the doped isolation feature 255. The light sensing feature 260 may be formed by a lithography process and a doping process. For example, the lithography process may use the same photomask in that was used to pattern the mask layer 220 except that a negative photoresist material is used instead of a positive photoresist material. In the present embodiment, the doping process uses an N-type dopant such as phosphorous to form the light sensing feature 260. In an alternative embodiment, the doping process may optionally use a P-type dopant such as boron to form the light sensing feature. In both embodiments, the light sensing feature 260 has a maximum width that is substantially equal to the width 208. In the present embodiment, the light sensing feature 260 is operable to detect light radiation.

It should be noted that the light sensing features of pixels 250A, 250B can be varied from one another, such as having different junction depths, thicknesses, and so forth. Additionally, it should be noted that the exact sequence of forming the doped isolation features and light sensing features described above is not important. For example, the light sensing feature may be formed before or after forming the doped isolation feature. Further, it is understood that although the pixels 250A and 250B are generally illustrated as photodiodes for the sake of example, other pixels types may be implemented including pinned layer photodiodes, photogates, reset transistors, source follower transistors, and transfer transistors.

The method 100 continues with block 150 in which the substrate is thinned from the back side so that the substrate has a second thickness that does not exceed a depth of the doped isolation feature. Referring to FIG. 2C, the substrate 202 is thinned down by a thinning process 290 from the backside 206. The thinning process 290 may include a grinding process, diamond scrubbing process, chemical-mechanical polishing (CMP) process, chemical etching, or other suitable techniques. A substantial amount of substrate material may be removed by the thinning process 290, and the substrate 202 has a new thickness 205B. In the present embodiment, the new thickness 205B is the optimized substrate thickness correlated to the effective implant depth 252 of the isolation feature 255.

Referring to Table 1 for an illustration of the present embodiment using boron as a dopant, Column H lists a range of values for the new thickness 205B of the substrate 202 with only a front side implant to form the isolation feature 255. As is shown by Table 1, the new thickness 205B is substantially equal to the effective implant depth 252 in the present embodiment. It can be observed that, when the isolation feature 255 is formed by using boron as a dopant and with the specified implantation energy, the effective implant depth 252 ranges from about 1.28 um to about 3.51 um, and thus the new thickness 205B of the substrate 202 ranges from about 1.28 um to about 3.51 um correspondingly. Similarly, when the isolation feature 255 is formed by using phosphorous as a dopant and with the specified implantation energy, the new thickness 205B of the substrate 202 ranges from about 0.75 um to about 2.46 um as the effective implant depth 252 ranges from about 0.75 um to about 2.46 um. It should be noted that although Tables 1 and 2 show thickness 205B (Column H) being substantially equal to the effective implant depth 252, the thickness 205B represents a maximum substrate thickness. Accordingly, the substrate 202 may be thinned down to a thickness that is less than the effective implant depth 252 in other embodiments. Thus, the isolation feature 255 substantially extends from the front side 204 to the backside 206 of the substrate 202 in the final device to effectively reduce cross-talk between the pixels 250A, 250B.

It should be noted that prior to thinning down the substrate 202, various structures and features may be formed on the front side 204 of the substrate 202. For example, an interconnect structure is formed on the front side 204 of the substrate 202. The interconnect structure includes a plurality of patterned dielectric layers and metal layers that provide interconnections (e.g., wiring) between the various doped features, circuitry, and input/output of the image sensor device 200. A buffer layer is formed on the interconnect structure. The buffer layer includes a dielectric material such as silicon oxide. Alternatively, the buffer layer may optionally include silicon nitride. The buffer layer is planarized to form a smooth surface by chemical mechanical polishing (CMP). A carrier substrate is bonded with the buffer layer so that processing the backside 206 of the substrate 202 can be performed. The carrier substrate may be similar to the substrate 202 and includes a silicon material. Alternatively, the carrier substrate may optionally include a glass substrate. The carrier substrate provides protection for the various features formed on the front side 204, and also provides mechanical strength and support for processing the backside 206 of the substrate 202.

Further, it is understood that the method 100 may continue with further processing to complete fabrication of the image sensor device 200. For example, a color filter layer is formed over the back side 206 of the substrate 202. The color filter layer can support different color filters (e.g., red, green, and blue), and may be positioned such that the incident light radiation is directed thereon and there through. The color filter layer includes a color filter for filtering light radiation of a first wavelength to the pixel 250A and a color filter for filtering light radiation of a second wavelength to the pixel 250B. The color filter layer may include a dye-based (or pigment based) polymer or resin for filtering a specific wavelength band. A plurality of micro-lens is formed over the color filter layer for directing light radiation towards the pixels 250A and 250B. The micro-lens may be positioned in various arrangements and have various shapes depending on a refractive index of material used for the micro-lens and distance from the sensor surface.

Figure 3:
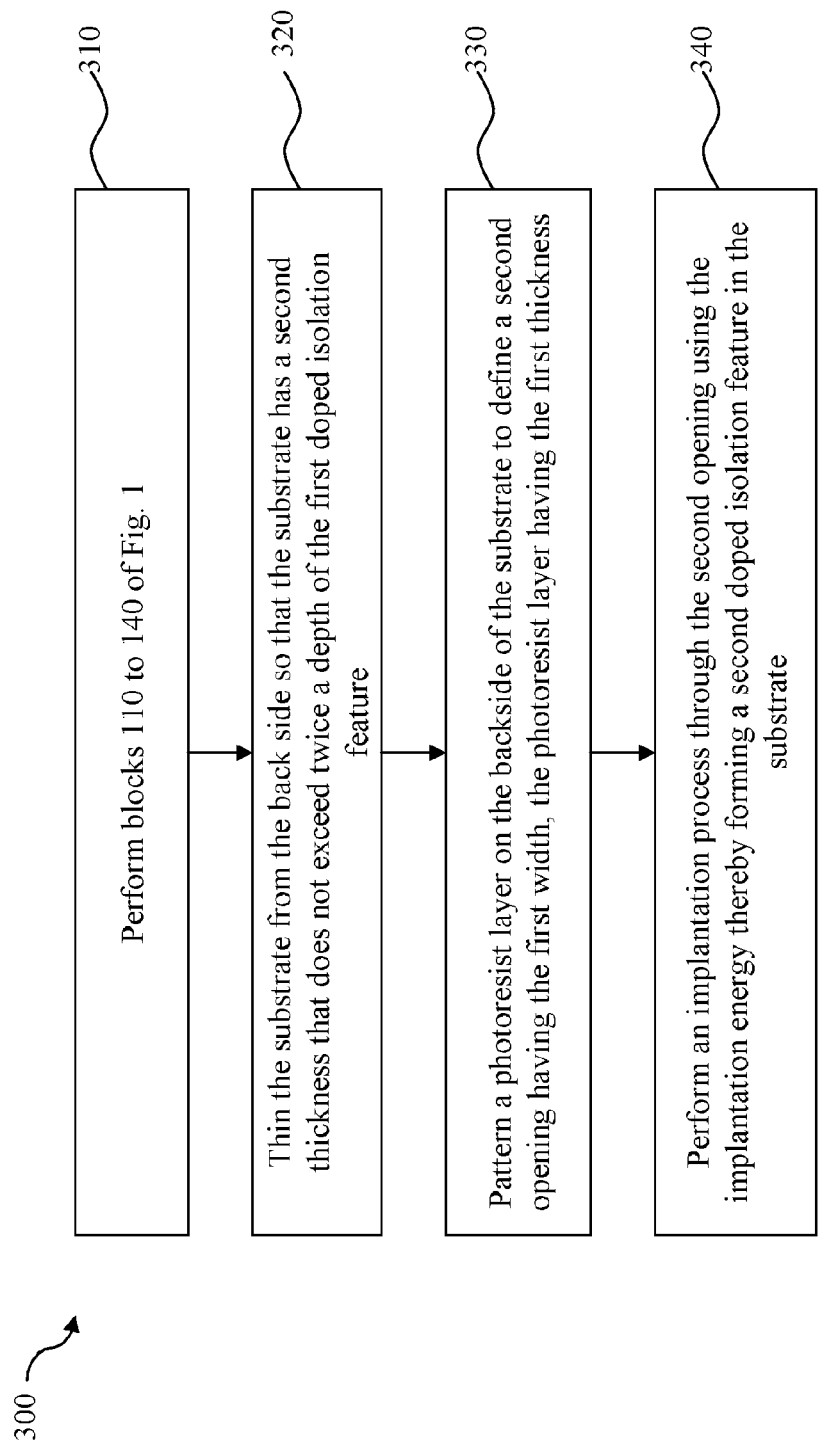
FIG. 3 is a flowchart illustrating an alternative method of fabricating an image sensor device according to various aspects of an alternative embodiment.
Figure 4A:
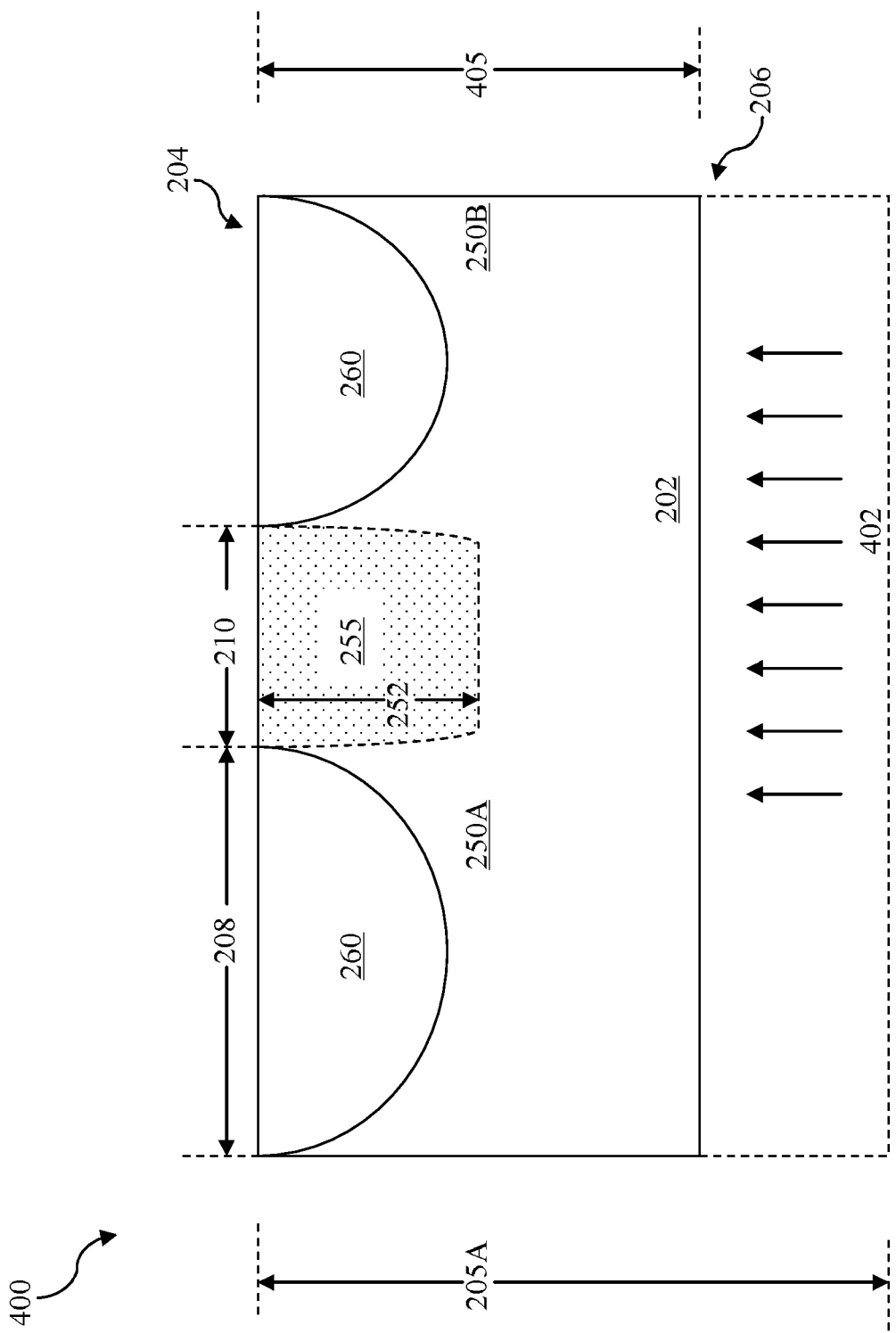
FIGS. 4A to 4B are cross-sectional views of an image sensor device at various stages of fabrication according to the method of FIG. 3.
Figure 4B:
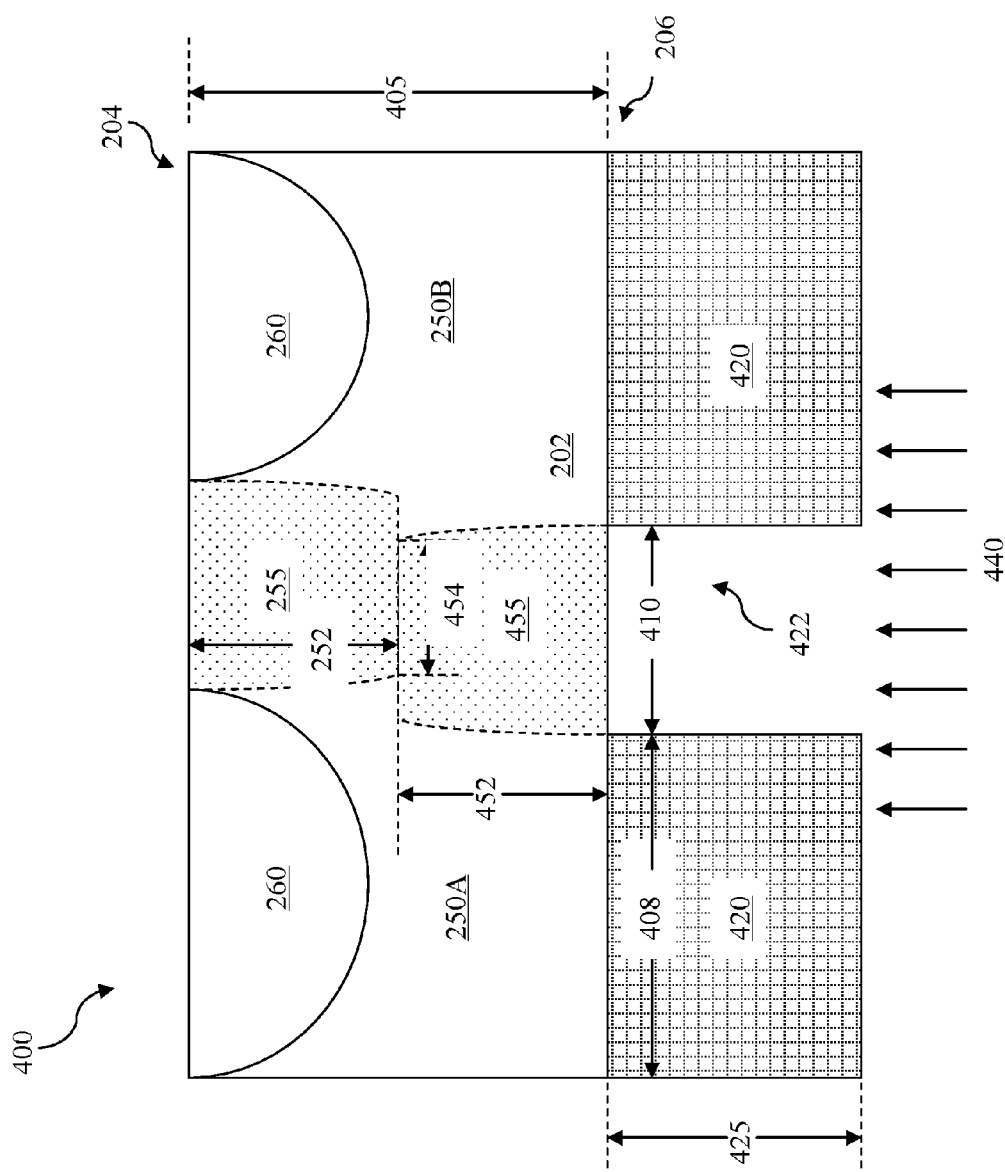

Referring to FIG. 3, illustrated is a flowchart of an alternative method 300 of fabricating an image sensor device according to various aspects of the present disclosure. Referring also to FIGS. 4A to 4B, illustrated are cross-sectional views of an image sensor device 400 at various stages of fabrication according to the method 300 of FIG. 3. The image sensor device 400 is similar to the image sensor device 200 of FIG. 2 except that the implantation process is performed to both the front side and the backside of the substrate to form the isolation feature. Accordingly, similar features in FIGS. 2 and 4 are numbered the same for the sake of simplicity and clarity. Additionally, the method 300 includes processes that are performed in the method of FIG. 1 as discussed below.

The method 300 begins with block 310 in which the processes described in blocks 110 to 140 of the method 100 of FIG. 1 are performed. The image sensor device 400 includes the isolation feature 255 and the light sensing feature 260 formed in the front side 204 of the substrate 202. The isolation feature 255 has a width 210 and a depth 252, and the light sensing feature has a width 208 as specified in Table 1 and Table 2. The method 300 continues with block 320 in which the substrate is thinned from the backside so that the substrate has a second thickness that does not exceed twice a depth of the first doped isolation feature. A thinning process 402 (similar to the thinning process 290 of FIG. 2) is performed to thin the substrate 202 from the backside 206 so that the substrate has a new thickness 405. The new thickness 405 is an optimized substrate thickness correlated to twice the effective implant depth 252 of the isolation feature 255. An isolation feature subsequently formed in the backside 206 of the substrate 202 may have substantially the same depth as the isolation feature 255 formed in the front side 204. Accordingly, the design provides a minimum pixel size (widths 208 and 210) with a maximum substrate thickness (2×depth 252) for high sensitivity and low cross-talk.

Referring to Column I of Tables 1 and 2 for an illustration of the correlative relationship between the new thickness 405 of the thinned substrate 202 and the effective implant depth 252. Table 1 illustrates that the new thickness 405 ranges from about 2.56 um to about 7.02 um corresponding to a range of the effective implant depth 252 from about 1.28 um to about 3.51 um, when the isolation feature 255 is formed by using boron as a dopant and with the specified implantation energy. Table 2 illustrates that the new thickness 405 ranges from about 1.5 um to about 4.92 um corresponding to a range of the effective implant depth 252 ranging from about 0.75 um to about 2.46 um, when the isolation feature 255 is formed by using phosphorous as a dopant and with the specified implantation energy. It should be noted that although Tables 1 and 2 show thickness 405 (Column I) being substantially equal to twice the effective implant depth 252, the thickness 405 represents a maximum substrate thickness. Accordingly, the substrate 202 may be thinned down to a thickness that is less than twice the effective implant depth 252 in other embodiments. Thus, the isolation feature 255 formed in the front side 204 and a subsequently formed isolation feature 455 formed in the backside 206 (discussed below) substantially extends from the front side 204 to the backside 206 of the substrate 202 in the final device to effectively reduce cross-talk between the pixels 250A, 250B.

The method 300 continues with block 330 in which a photoresist layer formed on the backside of the substrate is patterned to define a second opening having the first width, the photoresist layer having the first thickness. Referring now to FIG. 4B, a photoresist layer is patterned by a lithography process to form a mask layer 420 having an opening 422. The mask layer 420 has a width 408 substantially equal to width 208 and a thickness 425 substantially equal to the thickness 225 of the photoresist layer 220. The opening 422 has a width 410 substantially equal to the width 210 and is substantially aligned with the isolation feature 255. However, there may be some acceptable range of misalignment as will be discussed below.

The method 300 continues with block 340 in which an implantation process is performed through the second opening using the implantation energy thereby forming a second doped isolation feature in the substrate. An implantation process 440 is then performed to the backside 206 of the substrate 202 to form a doped isolation feature 455. The implantation energy is substantially the same as the implantation energy that was used to form isolation feature 255 as specified in Column F of Tables 1 and 2 and discussed above in FIG. 2. The doped isolation feature 455 includes a portion that overlaps with the doped isolation feature 255. In the embodiment shown here, the overlap portion 454 is greater than 0.1 um. The doped isolation feature 455 also has an effective implant depth 452 substantially equal to the effective implant depth 252 of the doped isolation feature 255. Accordingly, the doped isolation features 255 and 455 substantially extends from the front side 204 to the backside 206 of the substrate 202. The method 300 may continue with additional processing to complete fabrication of the image sensor device 400. For example, the mask layer 420 may be removed, and color filters and micro-lenses may be formed on the backside 206 of the substrate 202 as discussed above in FIG. 2.

In summary, the methods and devices disclosed herein provide an effective and efficient approach for thinning-down a substrate to an optimized thickness for a given pixel size. The methods and devices disclosed herein take advantage of determining a relationship between the pixel size and substrate thickness based on an aggressive design rule for the doped isolation feature. The design rule takes in to account a minimum photoresist width that is formed by the lithography process, a minimum exposure width of the lithography process, a minimum photoresist thickness for resisting an implantation energy used to form the doped isolation feature, and an effective implant depth of the implantation energy. In some embodiments, the doped isolation feature is formed in the front side of the substrate. In other embodiments, the doped isolation is formed in front side of the substrate and in the backside of the substrate after thinning down the substrate. In doing so, the present embodiment offers several advantages over prior art devices, it being understood that different embodiments may have different advantages and that no particular advantage is necessarily required for all embodiments. One advantage of the present embodiment is that the doped isolation feature and a light sensing region formed adjacent to it have an optimized relationship for sensing light and reducing cross-talk. Another advantage of the present embodiment is that the doped isolation feature having the optimized effective implant depth that extends from the front side to the backside of the substrate effectively reduces cross-talk between adjacent pixels.

The present disclosure describes a method for fabricating an image sensor device, including, providing a substrate having a front side and a backside, patterning a photoresist layer on the front side of the substrate to define an opening having a first width, the photoresist layer having a first thickness correlated to the first width, performing an implantation process through the opening using an implantation energy correlated to the first thickness thereby forming a first doped isolation feature in the substrate, forming a light sensing feature adjacent to the first doped isolation feature, the light sensing feature having a second width, and thinning the substrate from the backside so that the substrate has a second thickness that does not exceed twice a depth of the first doped isolation feature. A pixel size is substantially equal to a sum of the first and second widths.

The present disclosure also describes an image sensor device, including, a substrate having a front side, a backside, and a thickness, a doped isolation feature formed in the substrate, the doped isolation feature having a first width and a depth, the depth being substantially equal to the thickness of the substrate, and a light sensing feature formed adjacent to the doped isolation feature in the substrate, the light sensing feature having a second width. The first and second widths are determined by a pixel size and an optimization algorithm. The pixel size is a sum of the first and second widths and the optimization algorithm is based on a design rule of the doped isolation feature.

The present disclosure also describes a method of fabricating an image sensor device, including, determining a relationship between an optimized substrate thickness and a pixel size, the relationship being based on a design rule of a doped isolation feature, providing a semiconductor substrate having a front side and a backside, forming a first doped isolation region in the front side of the semiconductor substrate, the first doped isolation region having a first width, forming a light-sensing element in the semiconductor substrate, the light-sensing element having a second width, and thinning-down the semiconductor substrate from the backside such that a thickness of the semiconductor substrate does not exceed the optimized substrate thickness. The pixel size substantially equals to a sum of the first and second widths.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the various specified values in Tables 1 and 2 for the pixel size, substrate thickness, isolation features, and other features disclosed herein are examples. However, other values may be implemented when determining the relationship between the pixel size and substrate thickness based on formation of the isolation feature.

What is claimed is:

1. A semiconductor device, comprising:
a substrate;
a radiation-sensing region disposed in the substrate, the radiation-sensing region having a first width; and
an isolation region disposed in the substrate, the isolation region having a second width;
wherein the first width and the second width are correlated with each other, and
wherein the first and second widths are determined by a pixel size and wherein the pixel size is a sum of the first and second widths.

2. The semiconductor device of claim 1, wherein the first width and the second width are correlated by a predefined mathematical relationship.

3. The semiconductor device of claim 2, wherein the predefined mathematical relationship includes a ratio between the first width and the second width.

4. The semiconductor device of claim 3, wherein the ratio is in a numerical range from about 1.25 to about 1.85.

5. The semiconductor device of claim 1, wherein the semiconductor device is a semiconductor image sensor.

6. The semiconductor device of claim 5, wherein the image sensor includes a pixel having the pixel size, and wherein the radiation-sensing region and the isolation region are components of the pixel.

7. The semiconductor device of claim 5, wherein the semiconductor image sensor is a back side illuminated image sensor.

8. The semiconductor device of claim 1, wherein the radiation-sensing region and the isolation region are each doped with a respective dopant and have opposite doping polarities.

9. A semiconductor device, comprising:
a substrate; and
a pixel disposed in the substrate, the pixel containing a radiation-detection component and an isolation component;
wherein a size of the radiation-detection component is a function of a size of the isolation component, and
wherein the size of the radiation-detection component and the size of the isolation component are determined by a size of the pixel and wherein the size of the pixel is a sum of the size of the radiation-detection component and the size of the isolation component.

10. The semiconductor device of claim 9, wherein the size of the radiation-detection component and the size of the isolation component include lateral dimensions of the radiation-detection component and the isolation component, respectively.

11. The semiconductor device of claim 9, wherein the size of the radiation-detection component is a linear function of the size of the isolation component.

12. The semiconductor device of claim 11, wherein the linear function includes a coefficient that is in a range from about 1.25 to about 1.85.

13. The semiconductor device of claim 9, wherein:
the substrate includes a front surface and a back surface; and
the radiation-detection component is configured to detect a radiation wave that enters the substrate from the back surface.

14. The semiconductor device of claim 13, wherein the isolation component extends substantially from the front surface to the back surface.

15. The semiconductor device of claim 9, wherein the radiation-detection component and the isolation component are oppositely doped.

16. A semiconductor device, comprising:
a substrate having a front side and a back side;
a light-sensitive feature formed in the substrate from the front side, the light-sensitive feature having a first size measured in a lateral direction, the light-sensitive feature being sensitive to light projected from the back side of the substrate; and
an isolation feature formed in the substrate, the isolation feature having a second size measured in the lateral direction;
wherein:
the light-sensitive feature and the isolation feature have different doping polarities;
the first size and the second size vary within a predetermined range with respect to each other; and
a ratio of the first size and the second size vary from about 1.25 to about 1.85.

17. The semiconductor device of claim 16, wherein the light-sensitive feature and the isolation feature are portions of a pixel, and wherein the substrate contains a plurality of pixels.

18. The semiconductor device of claim 16, wherein the light-sensitive feature and the isolation feature are formed adjacent to each other.

19. The semiconductor device of claim 16, wherein a depth of the isolation feature is no greater than a thickness of the substrate.

20. The semiconductor device of claim 1, wherein the isolation region extends from a front surface of the substrate to a back surface of the substrate.

* * * * *